(12) United States Patent
Orii et al.

(10) Patent No.: US 6,863,741 B2
(45) Date of Patent: Mar. 8, 2005

(54) CLEANING PROCESSING METHOD AND CLEANING PROCESSING APPARATUS

(75) Inventors: Takehiko Orii, Nirasaki (JP); Mitsunori Nakamori, Nirasaki (JP)

(73) Assignee: Tokyo Electron Limited, Tokyo-To (JP)

( * ) Notice: Subject to any disclaimer, the term of this patent is extended or adjusted under 35 U.S.C. 154(b) by 344 days.

(21) Appl. No.: 09/907,690

(22) Filed: Jul. 19, 2001

(65) Prior Publication Data

US 2002/0007844 A1 Jan. 24, 2002

(30) Foreign Application Priority Data

Jul. 24, 2000 (JP) ........................................ 2000-222863

(51) Int. Cl.[7] .............................. B08B 7/04; B08B 7/00
(52) U.S. Cl. ............................ 134/30; 134/33; 134/34; 134/37; 134/95.1; 134/95.3; 134/102.1; 134/153; 134/99.1; 134/902
(58) Field of Search .............................. 134/26, 30, 32, 134/33, 34, 35, 36, 37, 902, 21, 25.1, 25.4, 95.1, 95.3, 102.1, 137, 153, 198, 99.1; 34/443, 448, 467

(56) References Cited

U.S. PATENT DOCUMENTS

| 5,487,398 A | * | 1/1996 | Ohmi et al. ............... 134/95.1 |
| 5,882,433 A | * | 3/1999 | Ueno .......................... 134/31 |
| 6,491,764 B2 | * | 12/2002 | Mertens et al. ............... 134/36 |
| 6,568,408 B2 | * | 5/2003 | Mertens et al. ............ 134/95.2 |
| 6,589,359 B2 | * | 7/2003 | Kamikawa et al. ........... 134/26 |

FOREIGN PATENT DOCUMENTS

JP      2001-70861      3/2001

* cited by examiner

*Primary Examiner*—Alexander Markoff
(74) *Attorney, Agent, or Firm*—Smith, Gambrell & Russell, LLP

(57) ABSTRACT

Where a substrate such as a semiconductor wafer held in a process space in a process chamber consisting of an outside chamber and an inside chamber is subjected to a cleaning processing, a chemical agent such as IPA or a solvent having a surfactant added thereto is supplied in the form of a mist or a vapor toward the substrate under the sate that the substrate is stopped or rotated at a low speed after processing with a chemical agent and a subsequent rinsing processing with a pure water. After the supply of the chemical agent is stopped, the substrate is rotated at a rotating speed higher than said low speed so as to centrifugally remove the chemical agent attached to the substrate.

10 Claims, 10 Drawing Sheets

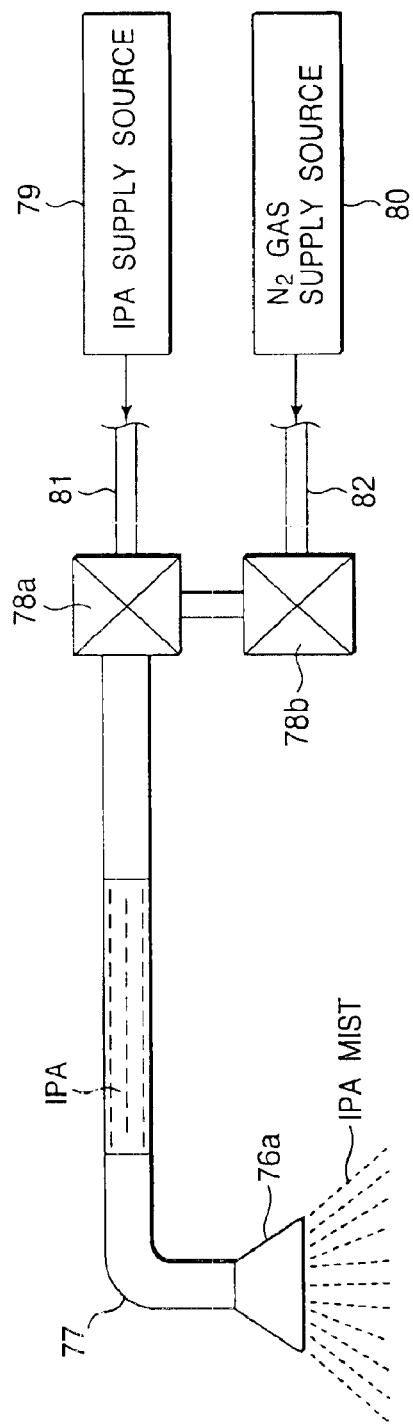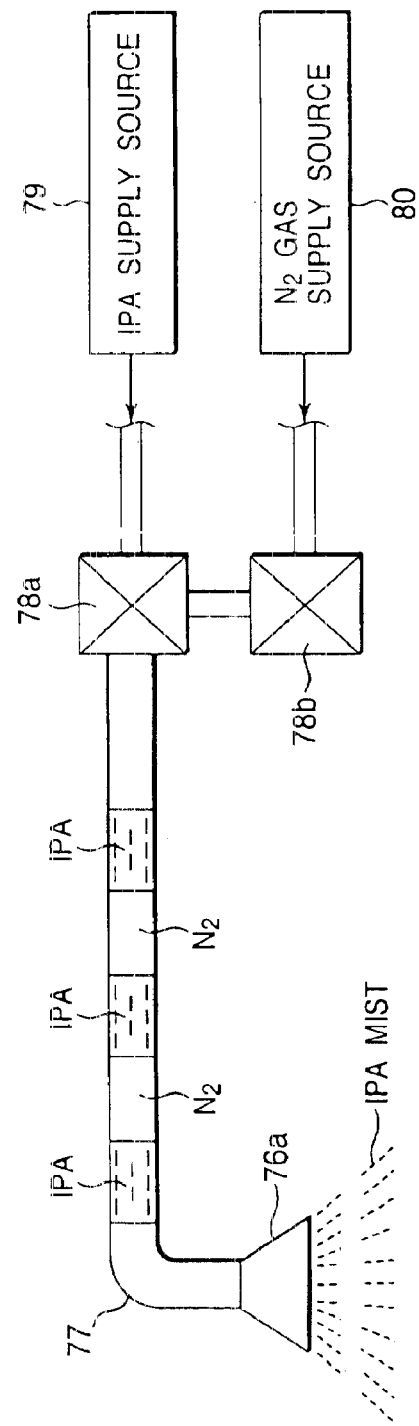
FIG.7A
FIG.7B

CLEANING PROCESSING METHOD AND CLEANING PROCESSING APPARATUS

BACKGROUND OF THE INVENTION

1. Field of the Invention

The present invention relates to a cleaning processing method and a cleaning processing apparatus for applying a cleaning processing to various substrates such as a semiconductor wafer and a LCD substrate by supplying a predetermined cleaning liquid to the substrates.

2. Description of the Related Art

In the manufacturing process of, for example, a semiconductor device, a cleaning processing is applied to the substrate of a semiconductor wafer with a predetermined chemical liquid or a pure water for removing particles, an organic contaminant, metal impurities, an organic material and an oxide film from the wafer. Such a cleaning processing includes in general a cleaning processing with a chemical liquid, a cleaning processing with a pure water, a drying processing with a volatile chemical agent, e.g., isopropyl alcohol (IPA), and a blow drying processing or a spin drying processing carried out by supplying a gas. These processings are carried out in the order mentioned.

The IPA drying processing is carried out by, for example, a method in which a wafer is dipped in a tank housing IPA, followed by pulling up the wafer, or a method in which a liquid IPA is supplied onto a wafer, which is rotated at a low speed, followed by rotating the wafer at a high speed so as to centrifugally remove the IPA attached to the wafer.

However, in the method in which the wafer is dipped in a tank housing IPA, the contamination of IPA proceeds with time, with the result that the particles within IPA are attached to the wafer. Further, where a liquid IPA is supplied to the wafer that is stopped or rotated at a low speed, IPA is consumed in a large amount, leading to a high processing cost. As a result, the manufacturing cost is increased.

BRIEF SUMMARY OF THE INVENTION

A first object of the present invention is to provide a cleaning processing method in which a volatile chemical agent such as IPA is efficiently supplied onto the substrate surface so as to suppress the consumption of the chemical agent and a cleaning processing apparatus for working the cleaning processing method. Also, a second object of the present invention is to provide a cleaning processing method including a dry processing step using a volatile chemical agent capable of lowering the water mark generation on the surface of the substrate.

According to a first aspect of the present invention, there is provided a cleaning processing method of a substrate held in a process vessel, comprising a first step of supplying a chemical agent of a mist state or a vapor state toward the substrate under the state that the substrate is stopped or rotated at a low speed; and a second step of rotating the substrate at a rotating speed higher than said low speed after the supply of said chemical agent is stopped thereby to centrifugally remove the chemical agent attached to the substrate.

According to a second aspect of the present invention, there is provided a cleaning processing method of a substrate held in a process vessel, comprising a first step of supplying a chemical agent of a mist state or a vapor state to the substrate under the state that the substrate is stopped or rotated at a low speed; a second step of rotating the substrate at an intermediate speed after the supply of said chemical agent is stopped such that the chemical agent centrifugally removed from the substrate does not rebound from said process vessel; and a third step of rotating the substrate at a high speed thereby to centrifugally remove the chemical agent attached to the substrate.

According to a third aspect of the present invention, there is provided a cleaning processing method applied to a substrate held in a process vessel, comprising a cleaning step for cleaning the substrate by supplying a chemical liquid to the substrate; a rinsing step for rinsing the substrate by supplying a pure water to the substrate; a drying step with a chemical agent for removing the pure water by supplying a chemical agent to the substrate; and a gas drying step for drying the substrate by supplying a gas to the substrate; wherein said drying step with a chemical agent includes a chemical agent supplying step for supplying a chemical agent of a mist state or a vapor state to the substrate under the state that the substrate is stopped or rotated at a low speed; a first drying step for rotating the substrate at an intermediate speed after the supply of said chemical agent is stopped such that the chemical agent centrifugally removed from the substrate does not rebound from said process vessel; and a second drying step for rotating the substrate at a high speed thereby to centrifugally remove the chemical agent attached to the substrate.

Further, according to a fourth aspect of the present invention, there is provided a cleaning processing apparatus for performing a cleaning processing by supplying a cleaning liquid to a substrate, comprising a process vessel for containing the substrate; a holder for holding the substrate in said process vessel; a rotating mechanism for rotating said holder; a cleaning liquid supply mechanism for spurting the cleaning liquid toward the substrate; and a chemical agent supply mechanism for supplying a chemical agent in a mist state or a vapor state to the substrate held by said holder.

According to the cleaning processing method and the cleaning processing apparatus of the present invention constructed as described above, a chemical agent is supplied in a mist state or a vapor state so as to decrease the amount of the chemical agent used, thereby lowering the processing cost. It should also be noted that the supplied chemical agent is uniformly attached to the substrate, with the result that, where, for example, water remains on the substrate surface, the volatile chemical agent is substituted for the water and, thus, the water is readily removed centrifugally. It follows that it is possible to suppress the water mark generation on the substrate surface, making it possible to maintain a high quality of the substrate.

It should also be noted that the cleaning processing apparatus of the present invention is capable of performing the processing without moving the substrate even in the case where another liquid processing such as a rinsing processing with a pure water is performed before the drying step using a chemical agent, with the result that the construction of the apparatus is not rendered complex. As a result, the apparatus is prevented from becoming bulky.

BRIEF DESCRIPTION OF THE SEVERAL VIEWS OF THE DRAWING

FIG. 7A is a schematic view showing an example of a mechanism for spurting IPA of mist state from an IPA spurting nozzle in the cleaning processing unit shown in FIG. 3;

FIG. 7B is a schematic view showing another example of a mechanism for spurting IPA of mist state from an IPA spurting nozzle in the cleaning processing unit shown in FIG. 3;

DETAILED DESCRIPTION OF THE INVENTION

One embodiment of the present invention will now be described in detail with reference to the accompanying drawings. This embodiment is directed to a cleaning processing system constructed such that the transfer of a semiconductor wafer into and out of the cleaning processing system as well as the cleaning and drying of the wafer are consistently carried out in a batch system and to a cleaning processing method using the particular cleaning processing system. Also, this embodiment covers the case of using isopropyl alcohol (IPA), which is a volatile solvent, in the drying processing using a chemical agent, which is included in the cleaning processing step.

Figure 1:
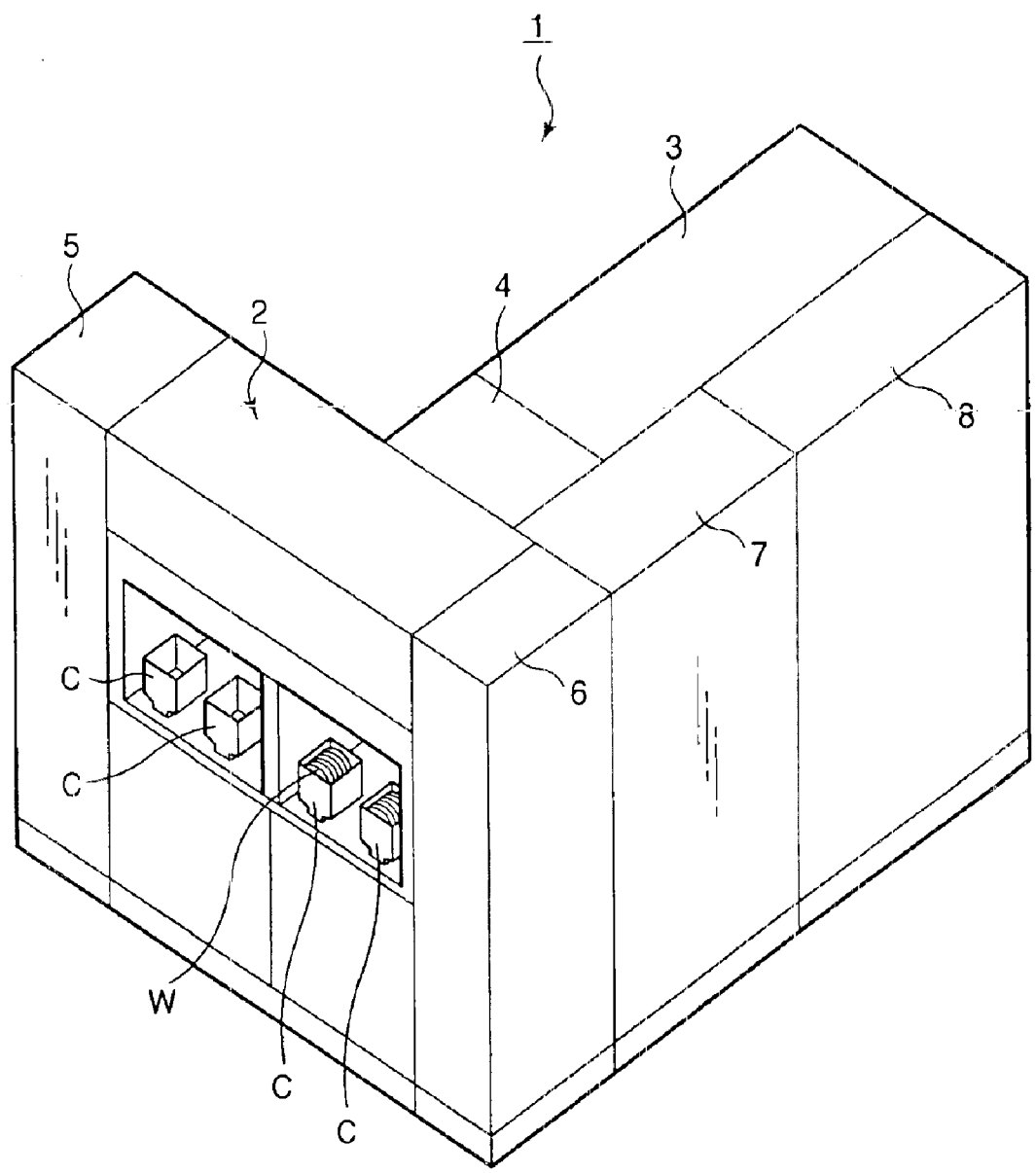
FIG. 1 is an oblique view schematically showing a cleaning processing system according to one embodiment of the present invention.
Figure 2:
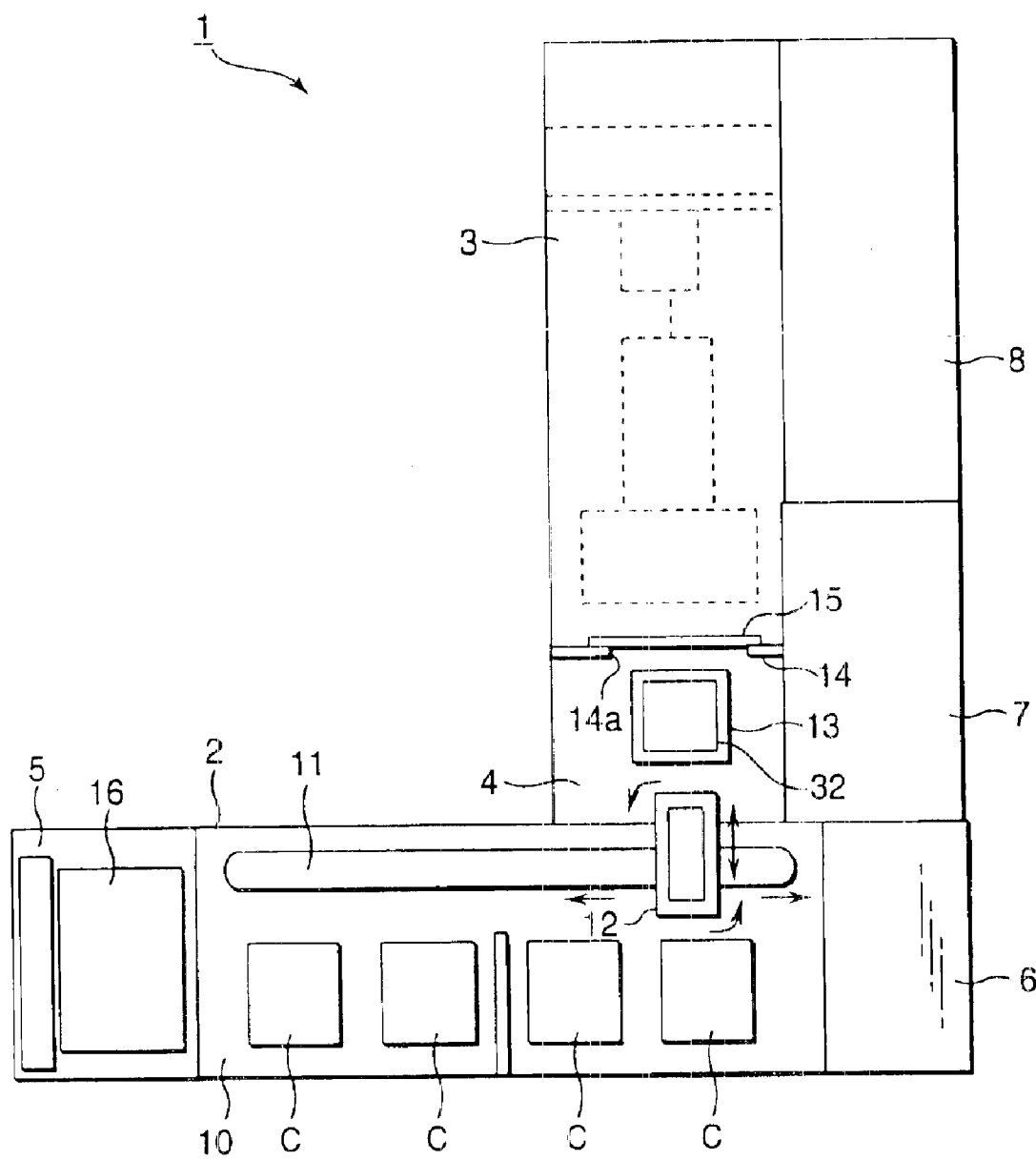
FIG. 2 is a plan view schematically showing the construction of the cleaning processing system shown in FIG. 1.

FIG. 1 is an oblique view showing a cleaning processing system 1, and FIG. 2 is a plan view of the system 1 shown in FIG. 1. As shown in FIGS. 1 and 2, the cleaning processing system 1 comprises an in-out port 2 for transferring a wafer W into and out of a carrier C capable of housing the wafer W, a cleaning processing unit 3 for applying a cleaning processing to the wafer W, a stage section 4 arranged between the in-out port 2 and the cleaning processing unit 3 for transferring the carrier C into and out of the cleaning processing unit 3, a carrier cleaning unit 5 for cleaning the carrier C, and a carrier stock unit 6 for stocking a plurality of carriers C. Incidentally, a reference numeral 7 denotes a power source unit, and a reference numeral 8 denotes a chemical liquid storing unit.

The in-out port 2 includes a table 10 on which four carriers C can be disposed, a transfer path 11 formed in the arranging direction of the carriers C, and a carrier transfer mechanism 12 for transferring the carrier C on the table 10 to the stage section 4 and for transferring the carrier C on the stage section 4 onto the table 10. The carrier transfer mechanism 12 is movable along the transfer path 11 in the arranging direction of the carriers C.

A plurality of wafers W, e.g., 25 or 26 wafers W, can be housed in the carrier C, and the carrier C is arranged on the table 10 such that the wafers W housed in the carrier C are held substantially vertical.

The stage section 4 includes a stage 13 on which the carrier C is disposed, and a slide stage 32 is arranged in the stage 13. The carrier C transferred from the in-out port 2 so as to be disposed on the slide stage 32 is transferred into the cleaning processing unit 3 by driving the slide stage 32, and the carrier C transferred into the cleaning processing unit 3 is transferred into the stage 13 by the slide stage 32.

Incidentally, the arm of the carrier transfer mechanism 12 is swung for transferring the carrier C from the table 10 onto the stage 13, with the result that the carrier C is disposed on the stage 13 in a direction opposite to that on the table 10. Therefore, an inverting mechanism (not shown) for inverting the direction of the carrier C is mounted to the stage 13.

A partition wall 14 is formed between the stage section 4 and the cleaning processing unit 3. An open portion 14a for transferring the carrier C is formed in the partition wall 14. The open portion 14a can be opened or closed by a shutter 15. During the processing, the shutter 15 is closed, and the shutter 15 is opened when the carrier C is transferred into and out of the cleaning processing unit 3.

A carrier cleaning unit 5 includes a carrier cleaning vessel 16. As described herein later, the carrier C from which the wafers W have been taken out in the cleaning processing unit 3 is cleaned in the carrier cleaning unit 5.

The carrier C housing the wafers W before the cleaning processing and the vacant carrier C from which the wafers W before the cleaning processing have been taken out are temporarily stored in the carrier stock unit 6. Housed in the carrier stock unit 6 is a carrier transfer mechanism for disposing a predetermined carrier C within the carrier stock unit 6 on the table 10 and for stocking the carrier C in a predetermined position.

Figure 3:
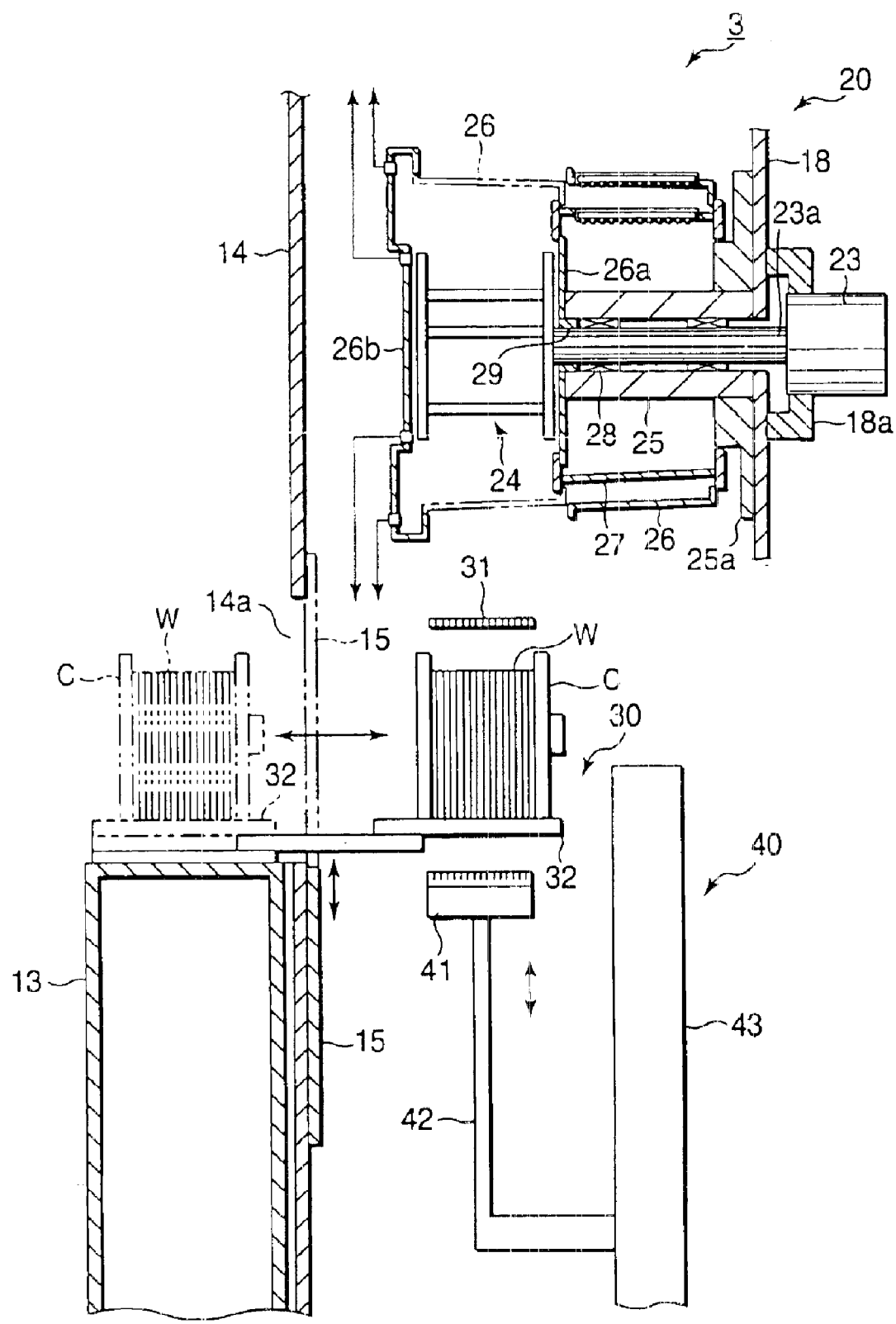
FIG. 3 is a cross sectional view schematically showing the cleaning processing unit of the present invention, which is incorporated in the cleaning processing system shown in FIG. 1.
Figure 4:
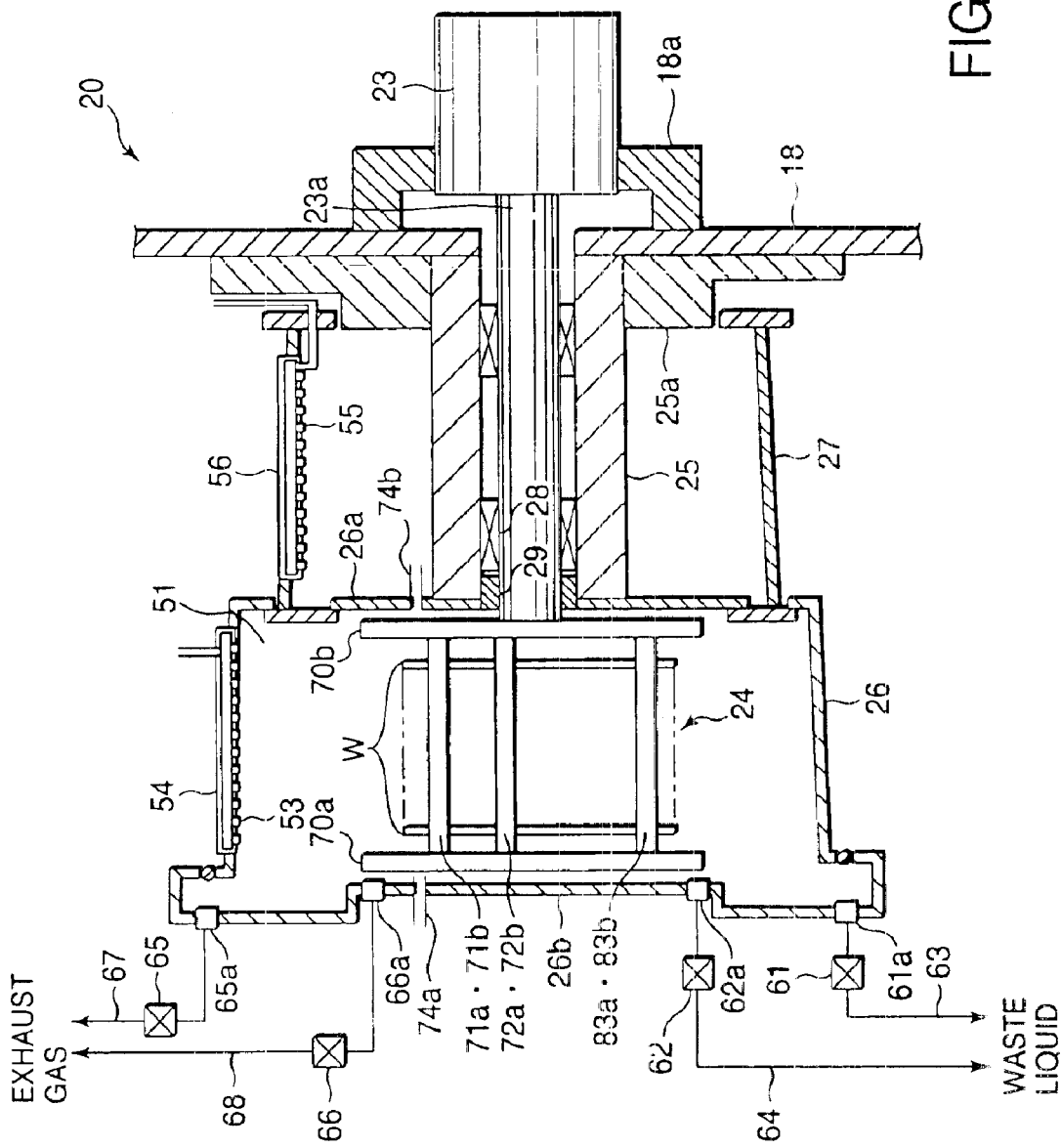
FIG. 4 is a cross sectional view schematically showing the state that an inside chamber is pulled out of an outside chamber in the cleaning processing unit shown in FIG. 3.
Figure 5:
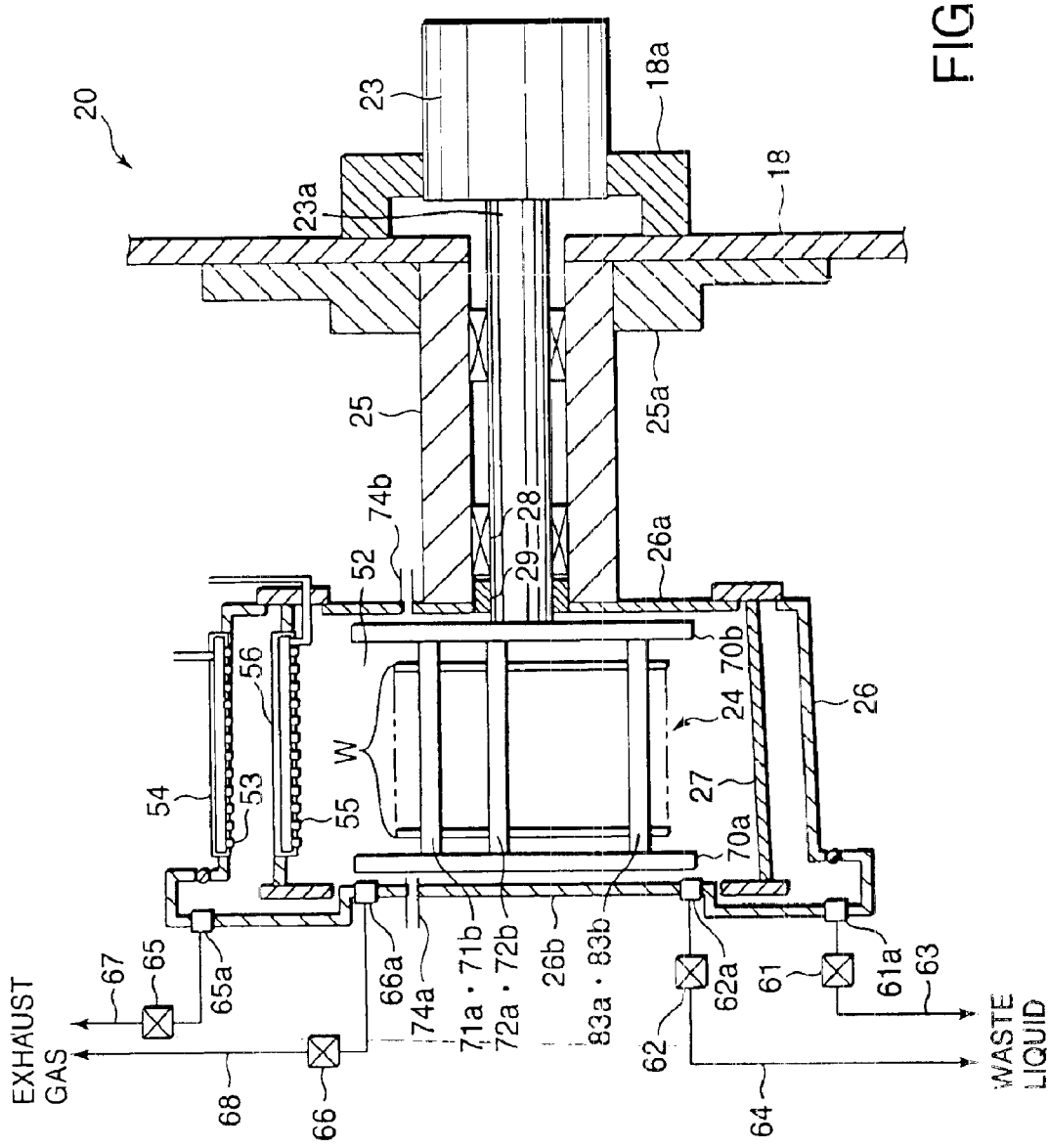
FIG. 5 is a cross sectional view schematically showing the state that an inside chamber is housed in an outside chamber in the cleaning processing unit shown in FIG. 3.

The cleaning processing unit 3 will now be described. FIG. 3 is a cross sectional view showing the internal structure of the cleaning processing unit 3, and FIGS. 4 and 5 are cross sectional views each showing a cleaning processing section 20 included in the cleaning processing unit 3.

FIG. 3 shows the state that an outside chamber 26 and an inside chamber 27 are moved to a retreat position denoted by solid lines in order to permit the delivery of the wafer W between a rotor 24 and a wafer holding member 42. On the other hand, FIG. 4 shows the state that the outside chamber 26 is in the operating position and the inside chamber 27 is in the retreat position so as to apply a cleaning processing to the wafer W held by the rotor 24 by using the outside chamber 26. Further, FIG. 5 shows the state that the inside chamber 27 is in the operating position so as to apply a cleaning processing to the wafer W held by the rotor 24 by using the inside chamber 27. Incidentally, when the inside chamber 27 is in the operating position, the outside chamber 26 is also in the operating position.

As shown in FIG. 3, arranged inside the cleaning processing unit 3 are the cleaning processing section 20, a carrier waiting section 30 positioned right under the cleaning processing section 20 for temporarily storing the carrier C, and a wafer transfer mechanism 40 for transferring the wafer W between the carrier C transferred into the carrier cleaning section 30 and the rotor 24 arranged in the cleaning processing section 20.

The slide stage 32 arranged on the stage 13 is of, for example, three-stage structure. By sliding the upper two stages of the slide stage 32 toward the carrier waiting section 30, the carrier C disposed on the uppermost stage can be transferred into a region right under the rotor 24 in the carrier waiting section 30.

As shown in FIG. 3, a wafer inspecting section 31 consisting of a plurality of pairs of optical sensors each consisting of a light emitting element and a light receiving element arranged to have a wafer transfer path sandwiched therebetween in the horizontal direction is arranged midway in the wafer transfer path above the carrier waiting section 30. When the wafers W pass through the wafer inspecting section 31, the number of wafers W is confirmed. It is also examined whether or not there is a wafer W that is not held normally, i.e., a so-called "jump slot".

The wafer transfer mechanism 40 includes a wafer holding section 41 for holding the wafers W, a support rod 42 extending vertical for supporting the wafer holding section 41, and a vertical driving section 43 for vertically moving the wafer holding member 41 via the support rod 42. By moving up and down the wafer holding member 41 by operating the vertical driving section 43, the wafers W before the cleaning processing, which are housed in the carrier C in the carrier waiting section 30, are transferred into the rotor 24 in the cleaning processing section 20 above the carrier waiting section 30, and the wafers W after the cleaning processing, which are mounted to the rotor 24, are transferred into the carrier C in the carrier waiting section 30.

For realizing the operation described above, the uppermost stage of the slide stage 32 having the carrier C disposed thereon is formed in the shape of a picture frame, and the wafer holding member 41 passes through the uppermost stage.

A plurality of holding grooves, e.g., 52 holding grooves, for holding the wafers W are formed at a predetermined pitch in the wafer holding member 41. In order to distinguish the holding grooves used for transferring the wafers W before the cleaning processing into the rotor 24 from the holding grooves for holding the wafers W after completion of the cleaning processing, the wafers W are held by every two holding grooves, thereby preventing the particles or the like from being attached to the wafer W after the cleaning processing.

The cleaning processing section 20, which serves to remove the resist mask as well as a polymer layer or the like, which is an etching residue, after the etching treatment of the wafer W, includes a supporting wall 18 that is arranged vertical, a motor 23 fixed to the supporting wall 18 by a fixing member 18a such that a rotary shaft 23a of the motor 23 extends horizontal, and a supporting cylinder 25 surrounding the rotary shaft 23a of the motor 23, as well as the outside chamber 26 and the inside chamber 27 for applying a predetermined cleaning processing to the wafer W held by the rotor 24.

The rotor 24 includes a pair of discs 70a, 70b arranged a predetermined distance apart from each other, engaging members 71a, 71b (the engaging member 71b being positioned behind the engaging member 71a), engaging members 72a, 72b (the engaging member 72b being positioned behind the engaging member 72a), and wafer holding members 83a, 83b (the holding member 83b being positioned behind the holding member 83a). Each of these engaging members 71a, 71b, 72a, 72b and the wafer holding members 83a and 83b is arranged between the discs 70a and 70b, and the wafer holding members 83a, 83b can be opened and closed. In the rotor 24, the wafer W is caught by the engaging members 71a, 71b, 72a, 72b and is held by the wafer holding members 83a, 83b. In this fashion, a plurality of wafers W, e.g., 26 wafers W, are held substantially vertical by the rotor 24 a predetermined distance apart from each other in the horizontal direction. If the motor 23 is driven, the rotor 24 is rotated via the rotary shaft 23a, and the wafers W held by the rotor 24 are also rotated.

The outside chamber 26 is in the shape of a cylinder and is formed movable between the operating position denoted by dash-double-dot lines in FIG. 3, or the operating position shown in FIGS. 4 and 5, and a retreat position denoted by solid lines in FIG. 3. When the wafer W is transferred into and out of the cleaning processing section 20, the outside chamber 26 is positioned in the retreat position as shown in FIG. 3. On the other hand, when the outside chamber 26 is in the operating position, and the inside chamber 27 is in the retreat position as shown in FIG. 4, a process vessel is constituted by the outside chamber 26, a vertical wall 26a on the side of the motor 23 and another vertical wall 26b on the opposite side with the rotor 24, and a process space 51 is defined in the process vessel.

The vertical wall 26a is mounted to the supporting cylinder 25, and a bearing 28 is mounted between the supporting cylinder 25 and the rotary shaft 23a. Also, the tip portions of the vertical wall 26a and the supporting cylinder 25 are sealed by a labyrinth seal 29 so as to prevent the particles or the like generated from the motor 23 from entering the process space 51. Further, engaging members 25a engaging with the outside chamber 26 and the inside chamber 27 are mounted to the supporting cylinder 25 on the side edge portion of the motor 23.

The inside chamber 27 is in the shape of a cylinder having a diameter smaller than that of the outside chamber 26. The inside chamber 27 is movable between the operating position shown in FIG. 4 and the retreat position on the outside of the supporting cylinder 25 shown in FIG. 3 and 4. During transfer of the wafer W, the inside chamber 27 and the outside chamber 26 are held in the retreat position. Also, when the inside chamber 27 is in the operating position as shown in FIG. 5, a process vessel is constituted by the inside chamber 27 and the vertical walls 26a, 26b, and a process space 52 is defined in the process vessel. Each of the process space 51 and the process space 52 is hermetically sealed by a seal mechanism.

Two spurting nozzles 54 each having a large number of spurting ports 53 are mounted to the upper wall portion of the outside chamber 26, though only one spurting nozzle 54 is shown in FIGS. 3 to 5. Each of these spurting nozzles 54 is arranged to permit the spurting ports 53 to be arranged in the horizontal direction. A pure water, a volatile chemical agent such as IPA, various chemical liquid, a nitrogen gas ($N_2$), etc., which are supplied from supply sources (not shown) can be spurted from the spurting nozzles 54. The liquid material spurted from the spurting nozzle 54 is spurted in the form of, for example, a liquid film conically expanding downward from the spurting port 53 so as to permit the liquid material to strike uniformly against the wafer W.

Two spurting nozzles 56 each having a large number of spurting ports 55 are mounted to the upper wall portion of the inside chamber 27, though only one spurting nozzle 56 is shown in FIGS. 3 to 5. Each of these spurting nozzles 56 is arranged to permit the spurting ports 55 to be arranged in the horizontal direction. A pure water, IPA, various chemical liquid, a nitrogen gas ($N_2$), etc., which are supplied from supply sources (not shown), can be spurted from the spurting nozzles 56. The liquid material spurted from the spurting nozzle 56 is spurted in the form of, for example, a liquid film expanding downward in a fan shape from the spurting port 54 so as to permit the liquid material to strike uniformly against a single wafer W.

It is possible to mount more than two spurting nozzles 54 to the outside chamber 26. It is also possible to mount more than two spurting nozzles 56 to the inside chamber 27. Further, nozzles differing in construction depending on the kinds of the process liquid to be handled can also be mounted in addition to the spurting nozzles 54 and 56 to the positions other than the upper portions of the inside and outside chambers. It is desirable for these spurting nozzles 54, 56 to be formed of fluorocarbon polymers such as PTFE and PFA. It is also possible to use stainless steel for forming these spurting nozzles 54, 56.

A spurting nozzle for spurting, for example, a pure water is mounted to the upper portion of the inner wall of the inside chamber 27 for washing the inner surfaces of the discs 70a, 70b facing the wafer W. Also, spurting nozzles 74a, 74b for spurting, for example, a pure water are mounted to the vertical walls 26a, 26b for washing the outer surfaces of the discs 70a, 70b facing the vertical walls 26a, 26b.

Figure 6A:
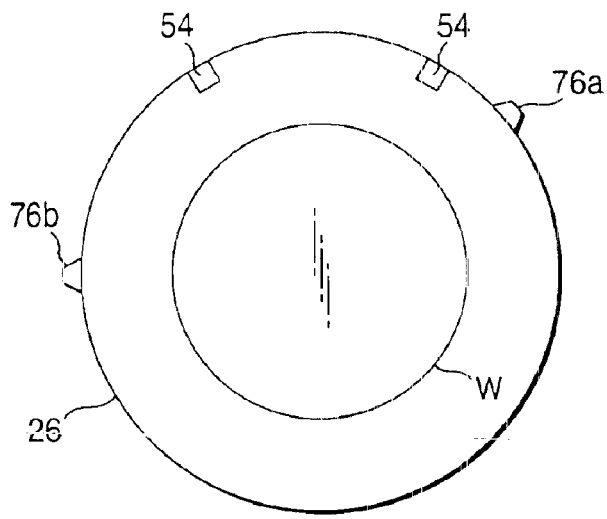
FIG. 6A is a front view showing the mounting positions of various spurting nozzles mounted to the outside chamber.
Figure 6B:
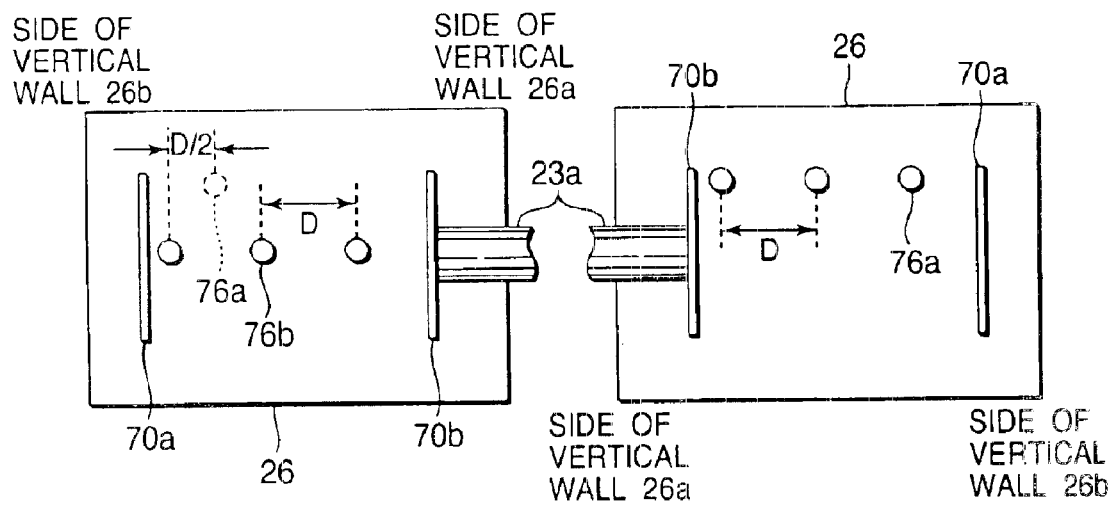
FIG. 6B is a developed view showing the mounting positions of various spurting nozzles mounted to the outside chamber.

FIGS. 6A and 6B are a front view and a developed view, respectively, showing the mounting positions of the various spurting nozzles included in the outside chamber 26. Three IPA spurting nozzles 76a are arranged to form a single row in a horizontal direction in an obliquely upper portion of the outside chamber 26, and three IPA spurting nozzles 76b are arranged to form a single row in a horizontal direction in a side portion of the outside chamber 26. These IPA spurting nozzles 76a, 76b are equal to each other in construction.

As described above, it is certainly possible to spurt IPA from the spurting nozzle 54. However, IPA is spurted from the spurting nozzle 54 in the form of a liquid film. On the other hand, IPA of a mist state is spurted from the IPA spurting nozzles 76a, 76b.

It is desirable for IPA of a mist state to be spurted from the IPA spurting nozzles 76a, 76b in a manner to be expanded downward to form, for example, a substantially triangular pyramid so as to permit IPA of a mist state to be sprayed over the entire wafer W.

The shapes of the IPA spurting nozzles 76a, 76b are not particularly limited as far as IPA is spurted in a mist state from the IPA spurting nozzles 76a, 76b. For example, it is possible to form a small hole or a narrow slit in the tip portion of the IPA spurting nozzles 76a, 76b so as to permit IPA to be spurted through the small hole or the like.

In order to prevent IPA of a mist state spurted from the three IPA spurting nozzles 76a arranged to form a single row in the horizontal direction from colliding against each other before sprayed on the wafer W, the distance between the individual IPA spurting nozzles 76a and the expanding angle of IPA are controlled.

The distance D between the adjacent IPA spurting nozzles 76a is equal to the distance D between the adjacent IPA spurting nozzles 76b. However, the IPA spurting nozzles 76a and the IPA spurting nozzles 76b are arranged deviant from each other by D/2 in the longitudinal direction of the outside chamber 27. By arranging the IPA spurting nozzles 76a and the IPA spurting nozzles 76b deviant from each other in this fashion, it is possible to spray uniformly IPA of a mist state over the entire wafer W.

FIGS. 7A and 7B are schematic views showing examples of a mechanism for spurting IPA of mist state from the spurting nozzle, for example, the IPA spurting nozzle 76a. In order to permit IPA of a mist state to be spurted from the IPA spurting nozzle 76a, it is possible to form a small hole or a slit in the spurting port of the IPA spurting nozzle 76a and to blow IPA against the spurting port by utilizing a gas pressure as shown in FIGS. 7A, 7B. In this case, it is possible to convert IPA easily into a mist.

One end portion of an IPA supply pipe 77 is connected to the IPA spurting nozzle 76a, and a switching control valve 78a for the switching of the supply between IPA and an $N_2$ gas and for controlling the supply and stopping of the supply is mounted to the other end portion of the IPA supply pipe 77. The switching control valve 78a communicates with an IPA supply source 79 via a pipe 81 and with an $N_2$ control valve 78b for selectively supplying an $N_2$ gas. An $N_2$ gas is supplied from an $N_2$ gas supply source 80 to the $N_2$ control valve 78b via a pipe 82.

As a method for supplying IPA, a method may be employed in which the switching control valve 78a is operated to allow a predetermined amount, e.g., 100 ml, of IPA to remain in the IPA supply pipe 77 as shown in, for example, FIG. 7A, followed by opening the $N_2$ control valve 78b and the switching control valve 78a to supply an $N_2$ gas at a predetermined pressure from the $N_2$ supply source 80 into the IPA supply pipe 77. In this method, IPA is spurted in a mist state from the IPA spurting nozzle 76a by the pressure of the $N_2$ gas.

Also, as shown in FIG. 7B, the switching control valve 78a and the $N_2$ control valve 78b are operated to permit, for example, a sum of 100 ml of IPA and a predetermined amount of an $N_2$ gas to remain alternately within the IPA supply pipe 77, followed by introducing an $N_2$ gas into the IPA supply pipe 77 so as to permit IPA remaining in the IPA supply pipe 77 to be spurted intermittently in a mist state from the IPA spurting nozzle 76a. FIG. 7B shows that IPA remaining in the IPA supply pipe 77 is divided substantially uniformly. However, IPA need not be uniformly divided within the IPA supply pipe 77. Of course, the amount of the $N_2$ gas held between the adjacent IPA regions need not be uniform.

In the case of employing the particular IPA spurting method, IPA of a mist state can be uniformly attached to the surface of the wafer W even if IPA is supplied in a small amount, e.g., in an amount of 100 ml. It follows that, compared with the conventional method in which a liquid IPA is supplied to the wafer W, it is possible to markedly decrease the amount of IPA used. If the consumption of IPA is decreased, the processing cost can be lowered.

Also, compared with the conventional method in which the wafer W is dipped in an IPA storing tank, the method of the present invention does not necessitate an IPA storing tank. Naturally, the method of the present invention is free from the problem generated in the case of using an IPA storing tank, i.e., the problem that the particle or the like caused by the contamination with time of IPA is attached again to the wafer W.

It is desirable for the IPA spurting nozzles 76a, 76b to spurt a pure water, too. In this case, for example, a pure water of a mist state is supplied first to the wafer W so as to wet uniformly the surface of the wafer W, followed by supplying IPA in a mist state to the wafer W. Then, IPA is centrifugally removed by rotating the rotor 24 so as to dry uniformly the surface of the wafer W.

A first waste liquid port 61 for discharging the cleaning liquid after use from within the process space 51 under the state shown in FIG. 4 is arranged below the vertical wall 26b, and a second waste liquid port 62 for discharging the cleaning liquid after use from within the process space 52 under the state shown in FIG. 5 is arranged above the first waste liquid port 61. Also, a first waste liquid pipe 63 and a second waste liquid pipe 64 are connected to the first waste liquid port 61 and the second waste liquid port 62, respectively.

On the other hand, a first exhaust port 65 for exhausting the process space 51 under the state shown in FIG. 4 is mounted in an upper portion of the vertical wall 26b. Also, a second exhaust port 66 for exhausting the process space 52 under the state shown in FIG. 5 is mounted below the first exhaust port 65. It should be noted that a first exhaust pipe 67 and a second exhaust pipe 68 are connected to the first exhaust port 65 and the second exhaust port 66, respectively.

The cleaning processing method of the wafer W using the cleaning processing system 1 described above will now be described. In the first step, the carrier C housing the wafers W to be treated is disposed on a predetermined position of the table 10. Then, the carrier C is transferred into the stage section 4 by using the carrier transfer mechanism 12 so as to dispose the carrier C on the slide stage 32 mounted on the stage 13. Further, the slide stage 32 is moved toward the carrier waiting section 30, and each of the outside chamber 26 and the inside chamber 27 is slid to the waiting positions. Under this state, the wafer holding member 41 is moved upward by operating the vertical driving section 43. During the upward movement, the wafer holding member 41 holds the wafers W within the carrier C and transfers the wafers W into the rotor 24 in the cleaning processing section 20. The number of wafers W held by the wafer holding member 41 is examined by the wafer inspecting section 31 during the upward movement of the wafer holding member 41. After the wafers W are allowed to be held by the rotor 24, the wafer holding member 41 is moved downward.

In the next step, the outside chamber 26 is brought back to the operating position, followed by sliding the inside chamber 27 into the operating position so as to define the process space 52. Then, the rotor 24 is rotated at a predetermined rotating speed by rotating the motor 23 so as to rotate the wafers W. During rotation of the wafers W, a predetermined chemical liquid or the like is spurted from the spurting nozzle 56 so as to carry out the resist removing processing. This processing is carried out once or a plurality of times.

Then, the inside chamber 27 is slid to the retreat position so as to form the process space 51 defined by the outside chamber 26. Then, a rinsing processing with a pure water is performed in the process space 51. In performing the rinsing processing, the rotor 24 is rotated at a predetermined speed by rotating the motor 23 so as to rotate the wafers W. A pure water is spurted from the spurting nozzle 54 against the wafers W that are kept rotated so as to carry out the rinsing processing.

After completion of the rinsing processing, a drying processing with IPA is carried out. The initial step of the IPA drying processing is an IPA supplying step for allowing a predetermined amount of IPA in a mist state to be spurted from the IPA spurting nozzles 76a, 76b against the entire region of the wafer W. In this step, it is possible for the rotor 24 to be stopped or to be rotated at a low speed such that the IPA mist can be attached to the surface of the wafer W. The low speed rotation noted above denotes the rotating speed that permits the chemical liquid of a mist state to be brought into a sufficient contact with the surface of the wafer, said rotating speed lower than any of the intermediate rotating speed and the high rotating speed referred to herein later. Where the rotor 24 is rotated in the IPA supplying step, it is desirable for the rotating speed of the rotor 24 to be not higher than 100 rpm.

As described previously with reference to FIGS. 7A and 7B, the IPA mist or vapor can be spurted from the IPA spurting nozzles 76a, 76b by allowing a predetermined amount of IPA to remain in advance in the IPA supply pipe 77, followed by causing the remaining IPA to be spurted from the IPA spurting nozzles 76a, 76b by utilizing the $N_2$ gas pressure.

Since the IPA mist attached to the surface of the wafer W can be readily substituted for the water on the wafer, the IPA supply is stopped after the IPA supplying step so as to carry out a first drying processing such that the rotor 24 and the wafer W are rotated at an intermediate speed so as to centrifugally remove the water and IPA. The intermediate rotating speed noted above denotes the rotating speed that permits the chemical liquid of a mist state and the water having the chemical liquid of a mist state mixed therein to be centrifugally removed. The intermediate rotating speed is higher than the low rotating speed referred to previously. To be more specific, it is desirable for the rotor 24 to be rotated in the first drying processing at a rotating speed falling within a range of between about 100 rpm and about 300 rpm.

If the rotor 24 and the wafer W are rotated at a high speed, the water and IPA centrifugally removed from the wafer W or the rotor 24 are rebounded from, for example, the inner wall of the outside chamber 26, with the result that the rebounded water and IPA are attached again to the wafer W so as to contaminate the wafer W. In order to avoid the drawback, the rotor 24 and the wafer W are rotated at an intermediate speed in the first drying processing step. In considering this point, it is possible to rotate the rotor 24 at a higher speed than above range as far as the wafer W is not contaminated again with the water and IPA centrifugally removed from the wafer W and rebounded from the inner wall of the outside chamber 26.

After the first drying processing step, most of the water and IPA are centrifugally removed from the wafer W and the rotor 24. Therefore, the wafer W is rotated at a high speed in the second drying processing so as to dry the wafer W substantially completely. Since the water droplets etc. scattered from the rotor 24 and the wafer W in the second drying processing step are sufficiently small, the water droplets are not rebounded from, for example, the inner wall of the outside chamber 26, making it possible to obtain a satisfactory dried state. The high speed rotation noted above denotes the rotating speed higher than any of the low rotating speed and the intermediate rotating speed referred to previously. It is desirable for the high rotating speed to fall within a range of between about 300 rpm and about 800 rpm. It is possible to carry out the first drying processing and the second drying processing continuously by increasing the rotating speed continuously or stepwise.

In the case of employing such an IPA drying processing, i.e., the method of drying the wafer w by supplying IPA in a mist state to the wafer W held by the rotor 24, it is unnecessary to transfer the wafer W into another device before or after the IPA drying processing step. It follows that the construction of the apparatus can be simplified. In addition, it is possible to avoid the problem of the particle attachment accompanying the transfer of the wafer W.

Further, since the time required for the transfer of the wafer W can be saved, the through-put can be increased.

Incidentally, where a pure water as well as IPA can be spurted from the IPA spurting nozzles 76a, 76b, it is possible to supply a pure water from the spurting nozzle 54 onto the wafer W held by the rotor 24 so as to carry out the rinsing processing, followed by supplying a pure water mist onto the wafer W for uniformly wetting the surface of the wafer W and subsequently applying an IPA drying processing, thereby drying more uniformly the surface of the wafer W. In this fashion, it is possible to prevent more effectively the water mark generation.

After completion of the IPA drying processing, a gas drying processing is performed in which the wafer W is dried more completely by spurting, for example, an $N_2$ gas. In the gas drying processing, it is possible to have the rotor 24 and the wafer W held stationary or to rotate the rotor 24 and the wafer W at a predetermined rotating speed, e.g., at a high speed. By this gas drying processing, traces of IPA remaining on the surface of the wafer W after the IPA drying processing can be removed substantially completely.

Then, the outside chamber 26 is slid to the retreat position as shown in FIG. 3, and the wafer holding member 41 is moved upward with the wafers W received in the holding grooves differing from the holding grooves used when the wafers W were transferred previously into the rotor 24. When the wafer holding member 41 holding the wafers W after the cleaning processing is moved downward, the number of wafers W, etc. is confirmed again by the wafer inspecting section 31.

When the wafer holding member 41 passes through the carrier C in the carrier waiting section 30, the wafers W are housed in the carrier C. The carrier C housing the wafers W is transferred by driving the slide stage 32 into the stage section 4 and, then, disposed by the carrier transfer mechanism 12 on the table 10 of the in-out port 2. Further, the carrier C is transferred out of the table 10 manually or by an automatic transfer device, thereby finishing a series of the cleaning processing.

Another embodiment of the present invention will now be described.

In the embodiment described above, IPA of a mist state is sprayed from the IPA spurting nozzles 76a, 76b onto the entire wafer W in the first step in the IPA drying processing after completion of the rinsing processing. In this embodiment, however, IPA of a vapor state is supplied onto the entire wafer W.

IPA of a vapor state is spurted from the IPA spurting nozzles 76a, 76b arranged as shown in FIGS. 6A, 6B in this embodiment, too, as in the embodiment described above. In this embodiment, it is desirable for IPA of a vapor state to be spurted from the IPA spurting nozzles 76a, 76b in a downwardly flared shape substantially like a triangular pyramid so as to allow IPA of a vapor state to be sprayed onto the entire wafer W. The shapes of the IPA spurting nozzles 76a, 76b are not particularly limited as far as IPA can be spurted in a vapor state.

Figure 8A:
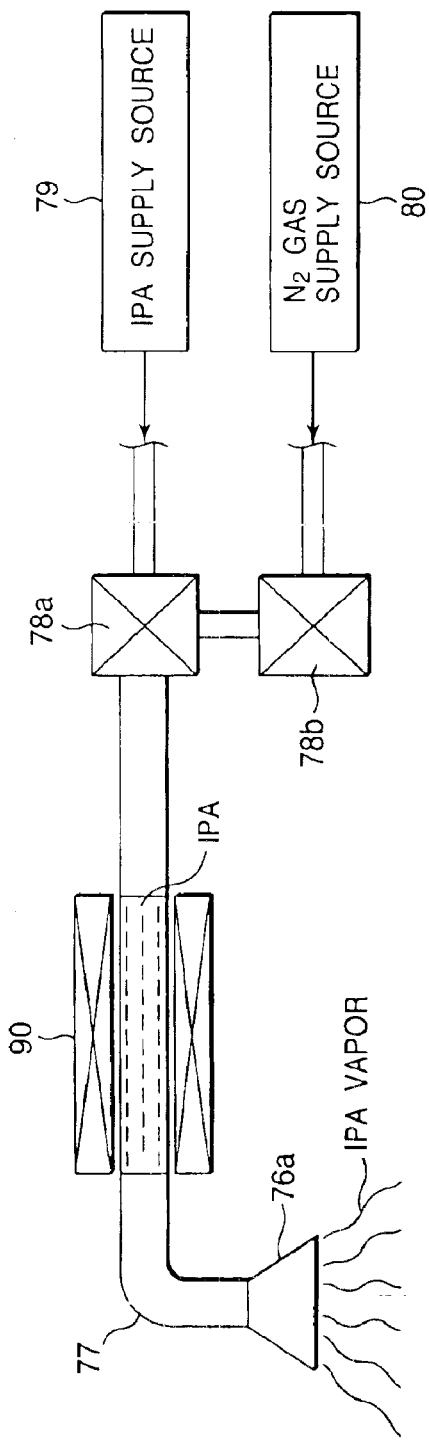
FIG. 8A is a schematic view showing an example of a mechanism for spurting IPA of vapor state from an IPA spurting nozzle in the cleaning processing unit shown in FIG. 3.
Figure 8B:
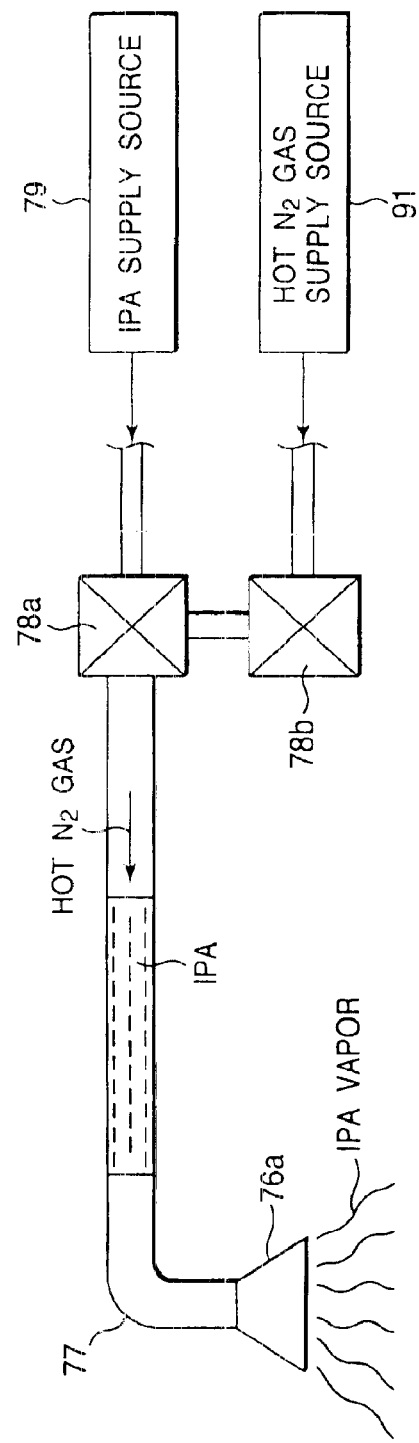
FIG. 8B is a schematic view showing another example of a mechanism for spurting IPA of vapor state from an IPA spurting nozzle in the cleaning processing unit shown in FIG. 3.

FIGS. 8A and 8B are schematic views showing examples of a mechanism for spurting IPA of vapor state from the IPA spurting nozzle, with the IPA spurting nozzle 76a taken as an example. The mechanisms shown in FIGS. 8A and 8B are close to the mechanisms shown in FIGS. 7A and 7B. The members of the mechanisms shown in FIGS. 8A and 8B which are equal to the members of the mechanisms shown in FIGS. 7A and 7B are denoted by the same reference numerals.

The mechanism shown in FIG. 8A is equal to the mechanism shown in each of FIGS. 7A and 7B, except that a heater 90 is arranged in the mechanism shown in FIG. 8A in a manner to surround that portion of the IPA supply pipe 77 in which IPA remains. The method of allowing IPA of a vapor state to be spurted from the IPA spurting nozzle 76a by the mechanism shown in FIG. 8A includes, for example, the operation that the switching control valve 78a is operated to allow a predetermined amount, e.g., 100 ml, of IPA to remain within the IPA supply pipe 77, and the IPA within the IPA supply pipe 77 is heated by the heater 90 so as to vaporize the IPA remaining within the IPA supply pipe 77, followed by opening the $N_2$ control valve 78b and the switching control valve 78a so as to supply the $N_2$ gas from the $N_2$ supply source 80 into the IPA supply pipe 77. As a result, the IPA vapor within the IPA supply pipe 77 is spurted from the IPA spurting nozzle 76a. In this case, IPA need not be converted into a mist as in the embodiment described previously and, thus, it suffices to supply slowly the $N_2$ gas.

The mechanism shown in FIG. 8B is constructed like the mechanism shown in each of FIGS. 7A and 7B, except that a hot $N_2$ gas supply source 91 is arranged in place of the $N_2$ gas supply source 80 shown in each of FIGS. 7A and 7B. The method of allowing IPA of a vapor state to be spurted from the IPA spurting nozzle 76a by the mechanism shown in FIG. 8B includes, for example, the operation that the switching control valve 78a is operated to allow a predetermined amount, e.g., 100 ml, of IPA to remain within the IPA supply pipe 77, and the $N_2$ control valve 78b and the switching control valve 78a are opened so as to supply the hot $N_2$ gas having a temperature of about 100 to 200° C. from the hot $N_2$ supply source 91 into the IPA supply pipe 77. As a result, the IPA within the IPA supply pipe 77 is vaporized by the hot $N_2$ gas and the vaporized IPA is spurted from the IPA spurting nozzle 76a.

The cleaning processing of the wafer W is performed by exactly the same procedure as that in the embodiment described previously even in the case where the drying processing is performed by using IPA of a vapor state.

The IPA vapor can be uniformly attached to the surface of the wafer W even if the amount of IPA supplied is small, e.g., 100 ml, in also the case of employing the IPA spurting method described above. It follows that the amount of IPA used can be markedly decreased, compared with the case where a liquid IPA is supplied to the wafer W for the coating as in the prior art. If the IPA consumption is decreased, the processing cost can be lowered.

An additional embodiment of the present invention will now be described.

In the two embodiments described above, a plurality of wafers are processed simultaneously. However, the cleaning processing method of the present invention can also be applied to the case where a single wafer W is subjected to the cleaning processing.

Figure 9:
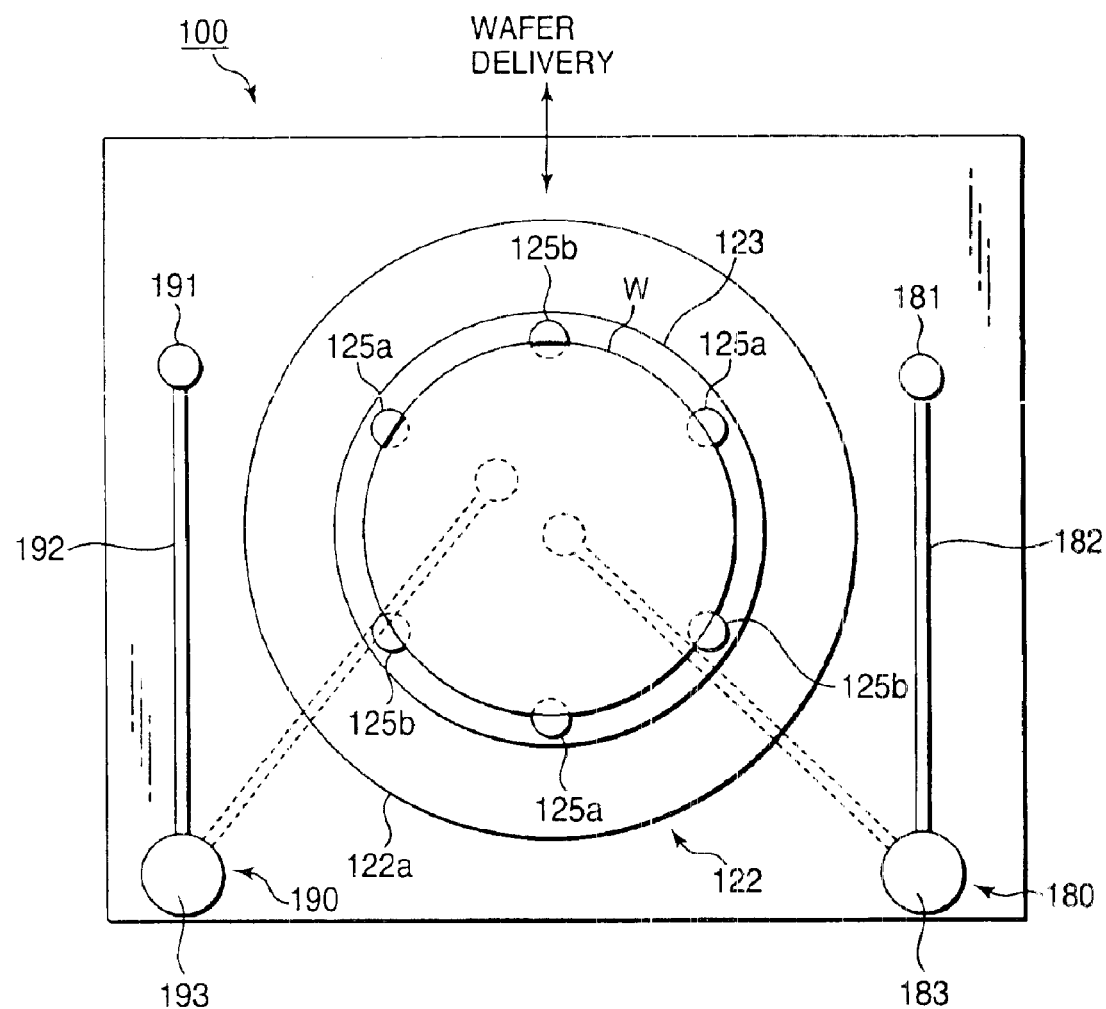
FIG. 9 is a plan view schematically showing a cleaning processing unit according to another embodiment of the present invention.
Figure 10:
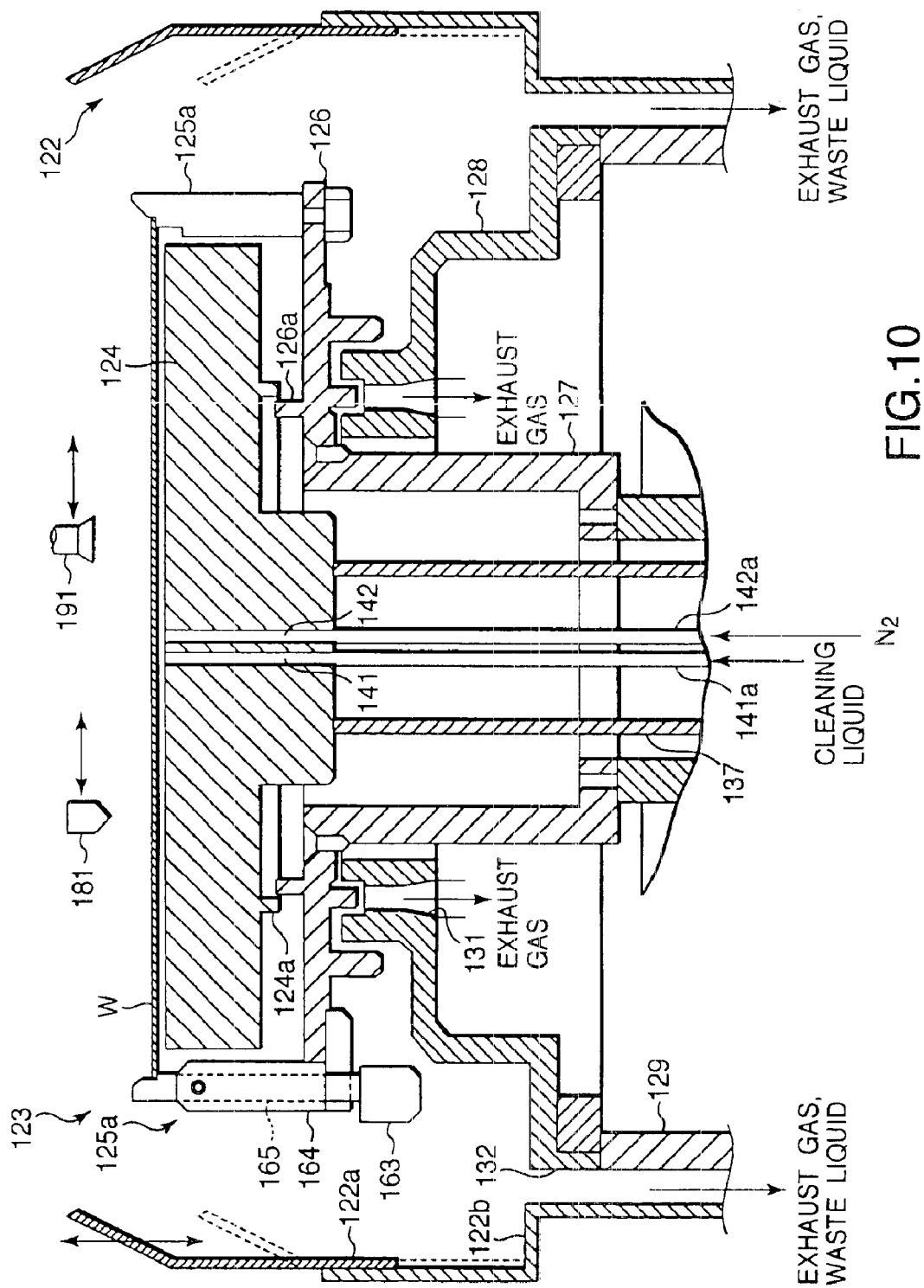
FIG. 10 is a cross sectional view schematically showing a process cup mounted in the cleaning processing unit shown in FIG. 9 and the internal structure of the process cup.

FIG. 9 is a plan view schematically showing a single wafer type cleaning processing unit 100, and FIG. 10 is a cross sectional view schematically showing the construction of the single wafer type cleaning processing unit 100. For example, the wafer W is transferred by a transfer device between the carrier C in which the wafer W is held substantially horizontal and the cleaning processing unit 100.

The cleaning processing unit 100 includes a process cup 122, a spin chuck 123 for holding the wafer W substantially horizontal, a stage 124 arranged to be positioned below the wafer W held by the spin chuck 123, a cleaning liquid supply mechanism 180 for supplying a predetermined cleaning liquid to the surface of the wafer W held by the spin chuck 123, and an IPA supply mechanism 190 for supplying IPA in a mist state or a vapor state to the wafer W.

The process cup 122 consists of a stationary outer cup 122b and a vertically movable inner cup 122a. When the wafer W is transferred onto the spin chuck 123 or when the wafer W is transferred out of the spin chuck 123, the process cup 122 is held at the dropped position denoted by dotted lines in FIG. 10, and is held at the elevated position denoted by the solid lines during the cleaning processing. A drain 132 for the exhaust operation and for discharging the used cleaning liquid is formed in the bottom portion of the outer cup 122b.

The spin chuck 123 includes a spin plate 126, three holding members 125a equidistantly mounted to the periphery of the spin plate 126, three support pins 125b equidistantly mounted to the periphery of the spin plate 126, and a hollow rotary shaft 127 that is rotated by a rotating mechanism (not shown). When the wafer W is transferred onto the spin chuck 123, wafer W is supported by the support pins 125b.

The holding member 125a consists of a support rod 164 fixed to the spin plate 126, a holding pin 165 supported by the support rod 164 and a weight 163 mounted to the lower portion of the holding pin 165. When the spin chuck 123 is rotated, the weight 163 is moved outward by the centrifugal force so as to incline the entire holding pin 165. As a result, the upper portion of the holding pin 165 holds the edge surface of the wafer W.

A stepped cover 128 is arranged to surround the rotary shaft 127 below the spin plate 126. The cover 128 is fixed to a base 129. An exhaust port 131 is formed inside the cover 128 such that the air within the process cup 122 is sucked by, for example, an exhaust pump (not shown).

The stage 124 is supported by a pivot 137 and a lift mechanism (not shown) is arranged below the pivot 137. By operating the lift mechanism, the stage 124 is moved upward or downward so as to be held at a predetermined height position.

For example, when the wafer W is transferred onto the spin chuck 123 or when the wafer W is transferred out of the spin chuck 123, the stage 124 is moved downward to the position where an annular projection 124a formed on the lower surface of the stage 124 abuts against the upper surface of the spin plate 126, and an annular projection 126a formed on the upper surface of the spin plate 126 abuts against the lower surface of the stage 124. By increasing the distance between the stage 124 and the wafer W in this fashion, the wafer W can be transferred easily onto and out of the spin chuck 123.

A cleaning liquid supply port 141 and a gas supply port 142 are formed to extend substantially through the central portion of the stage 124. Also, a cleaning liquid supply pipe 141a is connected to the cleaning liquid supply port 141. Likewise, a gas supply pipe 142a is connected to the gas supply port 142.

It is possible to spurt various chemical liquid, the pure water, and the cleaning liquid such as IPA, which are supplied through the cleaning liquid supply pipe 141a, from the cleaning liquid supply port 141 against the back surface of the wafer W. It is also possible to spurt an $N_2$ gas, which is supplied through the gas supply pipe 142a, from the gas supply port 142 against the back surface of the wafer W. What should be noted is that not only the front surface but also the back surface of the wafer W can be cleaned and dried in the cleaning processing unit 100.

The cleaning liquid supply mechanism 180 includes a cleaning liquid spurting nozzle 181 for spurting various chemical liquid, a pure water, a cleaning liquid such as IPA or an $N_2$ gas against the front surface of the wafer W held by the spin chuck 123, a holding arm 182 for holding the cleaning liquid spurting nozzle 181, a supporting rotary shaft 183 for supporting and rotating the holding arm 182 so as to permit the cleaning liquid spurting nozzle 181 to be moved to a predetermined position above the surface of the wafer W, and a cleaning liquid supply pipe (not shown) for supplying a predetermined cleaning liquid or the like to the cleaning liquid spurting nozzle 181. It is possible to move the cleaning liquid spurting nozzle 181 to a predetermined position above the wafer W and to scan the cleaning liquid spurting nozzle 181 above the wafer W by rotating the supporting rotary shaft 183 by a predetermined angle.

On the other hand, the IPA spurting mechanism 190 includes an IPA spurting nozzle 191 for supplying IPA in a mist state or a vapor state to the surface of the wafer W held by the spin chuck 123, a holding arm 192 for holding the IPA spurting nozzle 191, and a supporting rotary shaft 193 for supporting and rotating the holding arm 192 so as to permit the IPA spurting nozzle 191 to be moved to a predetermined position above the surface of the wafer W. It is possible to move the IPA spurting nozzle 191 to a predetermined position above the wafer W and to scan the IPA spurting nozzle 191 above the wafer W by rotating the supporting rotary shaft 193 by a predetermined angle.

The cleaning processing described below can be performed by using the cleaning processing unit 100 of the construction described above. In the first step, the wafer w is disposed on the spin chuck 123. Then, a predetermined chemical liquid is supplied from the cleaning liquid spurting nozzle 181 to both the front surface and the back surface of the wafer W while the spin chuck 123 is held stationary or rotated at a low speed. The state that the front and back surfaces of the wafer W are kept in contact with the chemical liquid is maintained for a predetermined period of time, thereby carrying out the processing with the chemical liquid.

In the next step, the spin chuck 123 is rotated at a predetermined rotating speed so as to centrifugally remove the chemical liquid from the wafer W. In this step, a pure water is supplied to the front and back surfaces of the wafer W that is kept rotated so as to carry out the rinsing processing of the wafer W. Then, the rotating speed of the spin chuck 123 is lowered, and IPA of a mist state or a vapor state is supplied from the IPA spurting nozzle 191 onto the front surface of the wafer W while swinging the nozzle holding arm 192 above the wafer W. At the same time, IPA is spurted from the cleaning liquid supply port 141 onto the back surface of the wafer W.

By the operation described above, it is possible to decrease the amount of IPA supplied to the front surface of the wafer W. Also, it is possible to prevent the water mark generation on the surface of the wafer W requiring a high cleaning accuracy.

Then, the supply of IPA onto the wafer W is stopped, followed by rotating the spin chuck 123 holding the wafer W at a high rotating speed of 3000 rpm to 5000 rpm. As a result, IPA is centrifugally removed from the wafer W so as to dry the wafer W. It is desirable to supply an $N_2$ gas toward the wafer W when the wafer W is rotated at a high rotating speed.

The present invention is not limited to the embodiments described above and can be modified in various fashions. For example, in the embodiment described above, IPA of a mist state or a vapor state is supplied to the wafer W. However, it is also possible to use a chemical agent having a surfactant added thereto in place of IPA. It is possible to effectively prevent the water mark generation on the wafer W by supplying a chemical agent having a surfactant added thereto to the wafer W in a mist state or a vapor state. It is possible for the solvent providing the basis of the chemical agent having a surfactant added thereto to be water or an organic solvent such as an ether.

Also, in the embodiment described above, the cleaning processing is carried out by using two process chambers, i.e., the outside chamber 26 and the inside chamber 27. However, it is possible to use only one chamber or three or more chambers. Further, it is possible for the cleaning processing unit 100 to be provided with a brush abutting against the surface of the wafer W so as to subject the surface of the wafer W to a scrub cleaning. Still further, in the embodiment described above, the technical idea of the present invention is applied to the cleaning processing of a semiconductor wafer. However, the technical idea of the present invention can also be applied to the cleaning processing of other substrates such as a substrate for a liquid crystal display (LCD) device.

The embodiments of the present invention described above are simply intended to clarify the technical idea of the present invention. Needless to say, the technical scope of the present invention should not be construed solely on the basis of the embodiments described above. In other words, the present invention can be worked in variously modified fashions based on the spirit of the present invention and within the scope of the claims which follow.

What is claimed is:

1. A cleaning processing method of a substrate held in a process vessel, comprising:

a first step of supplying a chemical agent of a mist state toward the substrate under the state that the substrate is stopped or rotated at a low speed; and a second step of rotating the substrate at a rotating speed higher than said low speed after the supply of said chemical agent is stopped thereby to centrifugally remove the chemical agent attached to the substrate, wherein said first step comprises allowing a predetermined amount of said chemical agent to remain in a nozzle for spurting said chemical agent or in a chemical agent supply pipe for supplying the chemical agent into said nozzle, followed by supplying a nitrogen gas into said chemical agent supply pipe for supplying said chemical agent to the substrate in a mist state.

2. The cleaning processing method according to claim 1, wherein said chemical agent and a nitrogen gas are allowed to remain alternately in said nozzle or in said chemical agent supply pipe, followed by supplying a nitrogen gas into said chemical agent supply pipe, thereby intermittently supplying said chemical agent to the substrate in a mist state.

3. A cleaning processing method of a substrate held in a process vessel, comprising:

a first step of supplying a chemical agent of a vapor state toward the substrate under the state that the substrate is stopped or rotated at a low speed; and a second step of rotating the substrate at a rotating speed higher than said low speed after the supply of said chemical agent is stopped thereby to centrifugally remove the chemical agent attached to the substrate, wherein said first step comprises allowing a chemical agent to remain in a nozzle for spurting the chemical agent or in a chemical agent supply pipe for supplying the chemical agent into said nozzle, followed by heating said nozzle or said chemical agent supply pipe thereby to supply said chemical agent to the substrate in a vapor state.

4. A cleaning processing method of a substrate held in a process vessel, comprising:

a first step of supplying a chemical agent of a vapor state toward the substrate under the state that the substrate is stopped or rotated at a low speed; and a second step of rotating the substrate at a rotating speed higher than said low speed after the supply of said chemical agent is stopped thereby to centrifugally remove the chemical agent attached to the substrate, wherein said first step comprises allowing a chemical agent to remain in a nozzle for spurting the chemical agent or in a chemical agent supply pipe for supplying the chemical agent into said nozzle, followed by supplying a hot nitrogen gas into said chemical agent supply pipe thereby to supply said chemical agent to the substrate in a vapor state.

5. A cleaning processing apparatus for performing a cleaning processing by supplying a cleaning liquid to a substrate, comprising:

a process vessel for containing the substrate;

a holder for holding the substrate in said process vessel;

a rotating mechanism for rotating said holder;

a cleaning liquid supply mechanism for spurting the cleaning liquid toward the substrate; and a chemical agent supply mechanism for supplying a chemical agent in a mist state to the substrate held by said holder, wherein said chemical agent supply mechanism includes a spurting nozzle for spurting said chemical agent, a chemical agent supply pipe for supplying the chemical agent into said spurting nozzle, and a gas supply mechanism for supplying a gas into said chemical agent supply pipe, and the gas is supplied after the chemical agent is allowed to remain in said spurting nozzle or said chemical agent supply pipe thereby to spurt the chemical agent remaining in said spurting nozzle or said chemical agent supply pipe in said mist state.

6. The cleaning processing apparatus according to claim 5, wherein said chemical agent supply mechanism further comprises a valve mechanism for the switching between the chemical agent supply and the gas supply into said chemical agent supply pipe, said valve mechanism being switched a plurality of times thereby to allow said chemical agent and said gas to remain alternately in said chemical agent supply pipe, followed by operating said valve mechanism to allow said chemical agent supply pipe to be connected to said gas supply mechanism, thereby allowing the chemical agent remaining in said spurting nozzle or in said chemical agent supply pipe to be spurted intermittently from said spurting nozzle in a mist state.

7. A cleaning processing apparatus for performing a cleaning processing by supplying a cleaning liquid to a substrate, comprising:

a process vessel for containing the substrate;

a holder for holding the substrate in said process vessel;

a rotating mechanism for rotating said holder;

a cleaning liquid supply mechanism for spurting the cleaning liquid toward the substrate; and a chemical agent supply mechanism for supplying a chemical agent in a vapor state to the substrate held by said holder, wherein said chemical agent supply mechanism comprises a spurting nozzle for spurting said chemical agent, a chemical agent supply pipe for supplying a chemical agent into said spurting nozzle, a mechanism for allowing said chemical agent to remain in said spurting nozzle or in said chemical agent supply pipe, and a heater for heating said nozzle or said chemical agent supply pipe, said chemical agent remaining in said spurting nozzle or said chemical agent supply pipe being vaporized by the heating by said heater, thereby spurting the chemical agent of a vapor state from said spurting nozzle.

8. A cleaning processing apparatus for performing a cleaning processing by supplying a cleaning liquid to a substrate, comprising:

a process vessel for containing the substrate;

a holder for holding the substrate in said process vessel;

a rotating mechanism for rotating said holder;

a cleaning liquid supply mechanism for spurting the cleaning liquid toward the substrate; and a chemical agent supply mechanism for supplying a chemical agent in a vapor state to the substrate held by said holder, wherein said chemical agent supply mechanism comprises a spurting nozzle for spurting said chemical agent, a chemical agent supply pipe for supplying a chemical agent into said spurting nozzle, a mechanism for allowing said chemical agent to remain in said spurting nozzle or in said chemical agent supply pipe, and a gas supply mechanism for supplying a high temperature gas into said chemical agent supply pipe, said chemical agent remaining in said spurting nozzle or in said chemical agent supply pipe being vaporized by the heating by a high temperature gas supplied from said gas supply mechanism, thereby spurting said chemical agent of a vapor state from said spurting nozzle.

9. A cleaning processing apparatus for performing a cleaning processing by supplying a cleaning liquid to a substrate, comprising:

a process vessel for containing the substrate;

a holder for holding the substrate in said process vessel;

a rotating mechanism for rotating said holder;

a cleaning liquid supply mechanism for spurting the cleaning liquid toward the substrate; and a chemical agent supply mechanism for supplying a chemical agent in a mist state or a vapor state to the substrate held by said holder, wherein a plurality of substrates, which are held substantially vertical, are arranged in the horizontal direction in said holder.

10. The cleaning processing apparatus according to claim 9, wherein said process vessel is of a double chamber structure consisting of an outside chamber and an inside chamber each capable of forming a hermetically sealed process chamber.

* * * * *